US007737085B2

(12) United States Patent
Arendt et al.

(10) Patent No.: US 7,737,085 B2
(45) Date of Patent: Jun. 15, 2010

(54) COATED CONDUCTORS

(75) Inventors: Paul N. Arendt, Los Alamos, NM (US); Stephen R. Foltyn, Los Alamos, NM (US); Liliana Stan, Los Alamos, NM (US); Igor O. Usov, Los Alamos, NM (US); Haiyan Wang, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 811 days.

(21) Appl. No.: 11/486,731

(22) Filed: Jul. 13, 2006

(65) Prior Publication Data

US 2007/0012975 A1   Jan. 18, 2007

Related U.S. Application Data

(60) Provisional application No. 60/699,241, filed on Jul. 13, 2005.

(51) Int. Cl.
*H01B 12/00* (2006.01)
*H01L 39/00* (2006.01)
*B32B 19/00* (2006.01)

(52) U.S. Cl. .................. 505/237; 505/238; 428/701; 428/702

(58) Field of Classification Search .................. 505/100, 505/230–232, 237–238, 434, 701; 428/698, 428/699, 701, 702; 29/599; 174/125.1
See application file for complete search history.

(56) References Cited

U.S. PATENT DOCUMENTS 5,547,921 A * 8/1996 Tani et al. .................... 505/124
6,150,034 A * 11/2000 Paranthaman et al. ....... 428/472
6,270,908 B1 8/2001 Williams et al.
6,498,549 B1 * 12/2002 Jiang et al. .................... 333/202
6,632,539 B1 * 10/2003 Iijima et al. .................. 428/472
6,743,533 B1 * 6/2004 Kakimoto et al. ........... 428/701
6,756,139 B2 6/2004 Jia et al.
6,933,065 B2 8/2005 Arendt et al.

(Continued)

OTHER PUBLICATIONS

Hasegawa et al, "Preparation of SmBa2Cu3Oy Films with improved in-plane alignment by Pulsed laser deposition," J. Japan Inst. Metals, 2002, V66 (4), pp. 320-328.*

(Continued)

*Primary Examiner*—Stanley Silverman
*Assistant Examiner*—Kallambella Vijayakumar
(74) *Attorney, Agent, or Firm*—Bruce H. Cottrell

(57) ABSTRACT

Articles are provided including a base substrate having a layer of an IBAD oriented material thereon, and, a layer of barium-containing material selected from the group consisting of barium zirconate, barium hafnate, barium titanate, barium strontium titanate, barium dysprosium zirconate, barium neodymium zirconate and barium samarium zirconate, or a cubic metal oxide material selected from the group consisting of rare earth zirconates and rare earth hafnates upon the layer of an IBAD oriented material. Such articles can further include thin films of high temperature superconductive oxides such as YBCO upon the layer of barium-containing material selected from the group consisting of barium zirconate, barium hafnate, barium titanate, barium strontium titanate, barium dysprosium zirconate, barium neodymium zirconate and barium samarium zirconate, or a cubic metal oxide material selected from the group consisting of rare earth zirconates and rare earth hafnates.

22 Claims, 1 Drawing Sheet

U.S. PATENT DOCUMENTS

2002/0082171 A1* 6/2002 Schoop et al. .............. 505/100
2003/0036483 A1* 2/2003 Arendt et al. ............... 505/239
2005/0159298 A1* 7/2005 Rupich et al. .............. 502/100
2007/0012975 A1 1/2007 Arendt et al.

OTHER PUBLICATIONS

Larbalestier, "Superconductor Flux Pinning and Grain Boundary Control," Science, vol. 274, pp. 736-737, Nov. 1, 1996.

* cited by examiner

US 7,737,085 B2

COATED CONDUCTORS

RELATED APPLICATIONS

This application claims the benefit of provisional application Ser. No. 60/699,241 filed Jul. 13, 2005.

STATEMENT REGARDING FEDERAL RIGHTS

This invention was made with government support under Contract No. DE-AC52-06NA25396 awarded by the U.S. Department of Energy. The government has certain rights in the invention.

FIELD OF THE INVENTION

The present invention relates to high temperature superconducting thick films on substrates, e.g., polycrystalline substrates, such superconducting thick films having high $J_c$'s and $I_c$'s, and relates to structural template articles for subsequent deposition of an oriented film, e.g., of superconducting thick films.

BACKGROUND OF THE INVENTION

U.S. Pat. No. 6,756,139 described a coated conductor architecture based on ion beam assisted deposited magnesium oxide (IBAD-MgO), which comprises four or five separately deposited layers between the metal substrate and the superconducting layer. Among the described structures are included: (1) a structure including a substrate/a layer of aluminum oxide ($Al_2O_3$)/a layer of yttrium oxide ($Y_2O_3$)/a layer of IBAD-MgO/a homoepitaxial layer of MgO/a layer of strontium ruthenate ($SrRuO_3$)/a layer of yttrium barium copper oxide (YBCO); and (2) a structure including a substrate/a layer of erbium oxide ($Er_2O_3$)/a layer of IBAD-MgO/a homoepitaxial layer of MgO/a layer of $SrRuO_3$/a layer of YBCO. Other architectures have employed strontium titanate in place of strontium ruthante or mixtures of strontium titanate and strontium ruthante.

Although excellent critical current density values have been achieved using either of these architectures, the homoepitaxial MgO layer has some drawbacks. The deposition rate of the homoepitaxial layer is undesirable slow, especially with a deposition process such as RF sputter deposition. Where the deposition process for the homoepitaxial MgO is reactive sputter deposition it can be difficult to precisely control the film thickness and the stoichiometry. Also, while much benchscale research on such materials has generally employed pulsed laser deposition (PLD) with production of high quality stoichiometric films, PLD is not presently preferred for commercial production of coated conductors.

Due to these problems, a substitute material for the homoepitaxial MgO layer is desired. Additionally, it is optionally desired that such a replacement material can be deposited using sputter deposition of a metal target.

After careful experimentation by the present inventors, a number of substitute materials have now been developed for the homoepitaxial MgO layer, including some substitute materials that can be deposited by high rate reactive sputter deposition.

SUMMARY OF THE INVENTION

In accordance with the purposes of the present invention, as embodied and broadly described herein, the present invention provides an article including a base substrate having a layer of an IBAD oriented material thereon, and, a layer of a barium-containing material selected from the group consisting of barium zirconate, barium hafnate, barium titanate, barium strontium titanate, barium dysprosium zirconate, barium neodymium zirconate and barium samarium zirconate, or a cubic metal oxide material selected from the group consisting of rare earth zirconates and rare earth hafnates, upon the layer of an IBAD oriented material. In one embodiment, the cubic metal oxide material layer, i.e., the rare earth zirconate and rare earth hafnate, is selected from the group of samarium zirconate, samarium hafnate, dysprosium zirconate, dysprosium hafnate, gadolinium zirconate, gadolinium hafnate, neodymium zirconate, neodymium hafnate, erbium zirconate, erbium hafnate, ytterbium zirconate, ytterbium hafnate. In one embodiment, the article of the present invention further includes a layer of a high temperature superconducting material such as YBCO. Preferably, the base substrate is a polycrystalline metal and is a composite base substrate including other layers such as an inert oxide material layer and an oxide or oxynitride material layer on the polycrystalline metal.

The present invention further provides a process of forming an article including a base substrate including a layer of an IBAD oriented material thereon, and, a layer of a cubic metal oxide material selected from the group consisting of rare earth zirconates and rare earth hafnates upon the layer of an IBAD oriented material, the process including depositing a layer of an IBAD oriented material upon the base substrate, and, depositing a layer of a cubic metal oxide material selected from the group consisting of rare earth zirconates and rare earth hafnates upon the layer of an IBAD oriented material by reactive sputtering.

DETAILED DESCRIPTION

Figure 1:
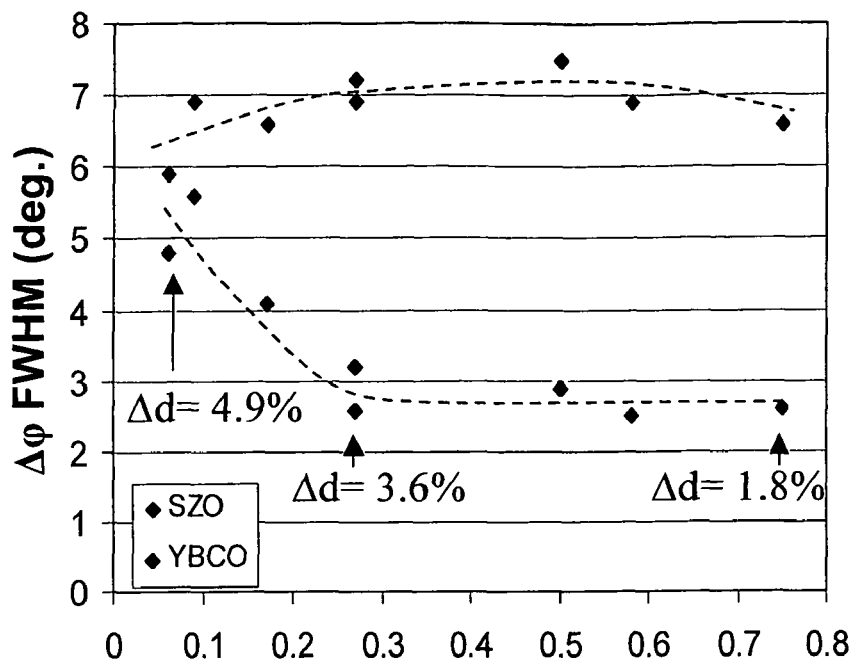
FIG. 1 shows in-plane full width half maximum texture values plotted versus samarium content in a samarium zirconate layer.
Figure 2:
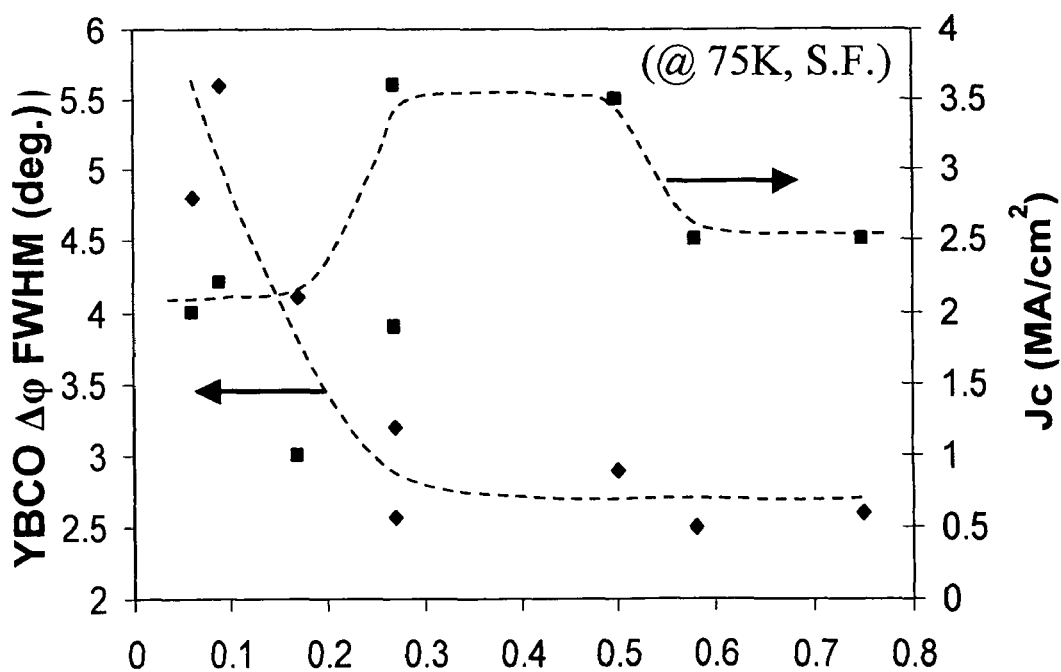
FIG. 2 shows critical current density (Jc) values plotted versus samarium content in a samarium zirconate layer.

The present invention is concerned with coated conductors, especially coated conductors including an IBAD-MgO layer and YBCO, although the article of the present invention may be used in other applications than superconductivity and with substrates other than with IBAD-MgO. In particular, the present invention is concerned with the replacement of any homoepitaxial MgO layer, generally deposited upon an IBAD MgO layer, with a layer of a barium-containing material selected from the group consisting of barium zirconate, barium hafnate, barium titanate, barium strontium titanate, barium dysprosium zirconate, barium neodymium zirconate, barium samarium zirconate, or a cubic metal oxide material selected from the group consisting of rare earth zirconates and rare earth hafnates.

The term "coated conductor" refers to flexible composite structures including a high temperature superconducting layer.

Barium-containing materials, such as barium zirconate, are generally chemically stable and do not react with YBCO at high temperatures. Additionally, such material can have a lattice match that is an intermediate transition between the YBCO and the underlying IBAD MgO layer. This ameliorates the probability of strain related misorientations occurring in the YBCO. Also, it can serve as a good diffusion barrier by preventing contamination of the YBCO from transition metal elements in the underlying metal substrate. Other barium-containing materials such as barium hafnate, barium titanate, barium strontium titanate, barium dysprosium zirconate, barium neodymium zirconate, and barium samarium zirconate are expected to benefit from similar properties.

Rare earth metals can form alloys with zirconium and hafnium and in the oxide form exist in cubic phases over a wide range of stoichiometries. Materials such as rare earth zirconium alloys and rare earth hafnium alloys can allow for reactive sputtering with oxygen at high rates onto a substrate. Further, the resultant zirconates and hafnates do not generally chemically interact with YBCO films at high temperatures.

The layer of barium-containing material selected from the group consisting of barium zirconate, barium hafnate, barium titanate, barium strontium titanate, barium dysprosium zirconate, barium neodymium zirconate, barium samarium zirconate can generally be from about 10 nanometers to about 100 nanometers in thickness. The buffer layer of barium-containing material selected from the group consisting of barium zirconate, barium hafnate, barium titanate, barium strontium titanate, barium dysprosium zirconate, barium neodymium zirconate, barium samarium zirconate can be deposited, e.g., by pulsed laser deposition or by methods such as evaporation including e-beam evaporation and activated reactive evaporation, cathodic arc deposition, chemical vapor deposition, organometallic chemical vapor deposition, plasma enhanced chemical vapor deposition, molecular beam epitaxy, a sol-gel process, liquid phase epitaxy and the like.

In the present invention, any high temperature superconducting (HTS) material is generally YBCO, e.g., $YBa_2Cu_3O_{7-\delta}$, $Y_2Ba_4Cu_7O_{14+x}$, or $YBa_2Cu_4O_8$, although other minor variations of this basic superconducting material, such as use of other rare earth metals as a substitute for some or all of the yttrium, may also be used. A mixture of the rare earth metal europium with yttrium may be one preferred combination as the superconducting material. Other superconducting materials such as bismuth and thallium based superconductor materials may also be employed. $YBa_2Cu_3O_{7-\delta}$ is generally preferred as the superconducting material. YBCO typically has a superconducting transition temperature of greater than about 87 K and such a temperature is presently generally considered as a high temperature for superconductive materials as it allows the use of liquid nitrogen as the coolant. Slightly lower temperatures may generally be considered as well as a high temperature for superconductive materials.

Addition of selected particulate materials to the high temperature superconducting material can enhance flux pinning properties. Such particulate materials can be of barium zirconate, yttrium barium zirconate, yttrium oxide and the like. The particulates are preferably sizes from about 5 nanometers to about 100 nanometers in major dimension and are generally present in amounts of from about 1 to about 20 weight percent.

In one embodiment of the present invention, an article is provided including a base substrate, an intermediate layer of an IBAD oriented material, and a layer of a barium-containing material selected from the group consisting of barium zirconate, barium hafnate, barium titanate, barium strontium titanate, barium dysprosium zirconate, barium neodymium zirconate and barium samarium zirconate, or a cubic metal oxide material selected from the group consisting of rare earth zirconates and rare earth hafnates upon the intermediate layer of an IBAD oriented material. One or more structural layers can be placed between the base substrate and the intermediate layer of an IBAD oriented material. Such structural layers can include a layer of an inert material such as aluminum oxide ($Al_2O_3$) and the like upon the base substrate and a layer of an oxide or oxynitride material such as $Y_2O_3$, AlON and the like on the layer of an inert material, thus forming a composite base substrate. Upon such a composite base substrate can be deposited the layer of an IBAD oriented material. Deposition by ion beam assisted deposition is now commonly referred to as IBAD.

In still other embodiments, the article can additionally include a layer of a high temperature superconducting material directly on the layer of barium-containing material selected from the group consisting of barium zirconate, barium hafnate, barium titanate, barium strontium titanate, barium dysprosium zirconate, barium neodymium zirconate and barium samarium zirconate, or a cubic metal oxide material selected from the group consisting of rare earth zirconates and rare earth hafnates. Optionally, other buffer layers, such as strontium titanate, strontium ruthanate, strontium titanium ruthanate, cerium oxide, yttrium oxide and the like, may be present between the layer of barium-containing materials or cubic metal oxide materials and the YBCO. In some cases, additional layers may not be generally preferred.

In the case of the rare earth ziconates and rare earth hafnates, while any composition may be generally useful, a preferred composition can generally have from about 0.06 to about 0.75 atomic percent rare earth metal of the total rare earth metal/zirconium metal content, more preferably from about 0.25 to about 0.75 atomic percent rare earth metal. Such compositions have been found to have comparable in-field performance to strontium titanate buffer layers in both terms of angular dependence and strength of field.

High temperature superconducting (HTS) layers, e.g., a YBCO layer, can be deposited, e.g., by pulsed laser deposition or by methods such as evaporation including e-beam evaporation and activated reactive evaporation, sputtering including magnetron sputtering, ion beam sputtering and ion assisted sputtering, cathodic arc deposition, chemical vapor deposition, organometallic chemical vapor deposition, plasma enhanced chemical vapor deposition, atomic layer deposition (a CVD process), molecular beam epitaxy, a sol-gel process, liquid phase epitaxy and the like.

In pulsed laser deposition, powder of the material to be deposited can be initially pressed into a disk or pellet under high pressure, generally above about 1000 pounds per square inch (PSI) and the pressed disk then sintered in an oxygen atmosphere or an oxygen-containing atmosphere at temperatures of about 950° C. for at least about 1 hour, preferably from about 12 to about 24 hours. An apparatus suitable for pulsed laser deposition is shown in Appl. Phys. Lett. 56, 578 (1990), "Effects of Beam Parameters on Excimer Laser Deposition of $YBa_2Cu_3O_{7-\delta}$", such description hereby incorporated by reference.

Suitable conditions for pulsed laser deposition include, e.g., the laser, such as an excimer laser (20 nanoseconds (ns), 248 or 308 nanometers (nm)), targeted upon a rotating pellet of the target material at an incident angle of about 45°. The substrate can be mounted upon a heated holder rotated at about 0.5 rpm to minimize thickness variations in the resultant film or coating, The substrate can be heated during deposition at temperatures from about 600° C. to about 950° C., preferably from about 700° C. to about 850° C. An oxygen atmosphere of from about 0.1 millitorr (mTorr) to about 10 Torr, preferably from about 100 to about 250 mTorr, can be maintained within the deposition chamber during the deposition. Distance between the substrate and the pellet can be from about 4 centimeters (cm) to about 10 cm.

The deposition rate of the film can be varied from about 0.1 angstrom per second (Å/s) to about 200 Å/s by changing the laser repetition rate from about 0.1 hertz (Hz) to about 200 Hz. Generally, the laser beam can have dimensions of about 1 millimeter (mm) by 4 mm with an average energy density of from about 1 to 4 joules per square centimeter ($J/cm^2$). After deposition, the films generally are cooled within an oxygen atmosphere of greater than about 100 Torr to room temperature.

The thin films of high temperature superconducting materials are generally from about 0.2 microns to about 10 microns in thickness, more preferably in the range of from about 1.5 μm to about 5 μm.

In the present invention, the high temperature superconducting material can be upon any suitable base substrate. For coated conductors of a high temperature superconducting material such as YBCO, the base substrate can be, e.g., a polycrystalline material such as polycrystalline metals or polycrystalline ceramics or can be a single crystal base substrate such as lanthanum aluminum oxide, aluminum oxide, magnesium oxide and the like. Also, the initial or base substrate can be an amorphous substrate such as silica, metallic glass, or glass. Also, the substrate may be selected from rolling-assisted biaxially textured substrates (RABiTs) including a metal such as nickel or copper, such substrates described, e.g., by Goyal et al., in U.S. Pat. No. 6,150,034. In one embodiment, the base substrate can be a polycrystalline metal such as a metal alloy. Nickel-based alloys such as various Hastelloy metals, Haynes metals and Inconel metals are useful as the base substrate. Iron-based substrates such as steels and stainless steels may be used as the base substrate. Copper-based substrates such as copper-beryllium alloys may also be useful as the base substrate. In one embodiment, the base substrate can be a polycrystalline ceramic such as polycrystalline aluminum oxide, polycrystalline yttria-stabilized zirconia (YSZ), forsterite, yttrium-iron-garnet (YIG), silica and the like.

A layer of an IBAD oriented material can be used within the article of the present invention as a critical layer between the base substrate (such as a polycrystalline metal) and an ultimate top-layer such as, e.g., a high temperature superconducting layer. The layer of IBAD oriented material can be a cubic oxide material and can have, e.g., a rock-salt-like structure. Such oriented cubic oxide materials can be, e.g., magnesium oxide, calcium oxide, strontium oxide, zirconium oxide, barium oxide, europium oxide, samarium oxide and other materials such as described in WO 99/25908 by Do et al. Other oriented materials may be used as well, e.g., cerium oxide having a fluorite structure, strontium ruthenate or lanthanum manganate having a perovskite structure, lanthanum aluminate having an orthorhombic structure, or a nitride material such as titanium nitride and the like. In the case of rolling-assisted biaxially textured substrates (RABiTs), one or more epitaxial oxide buffer layers can be deposited upon the biaxially-oriented surface of the substrate. Such epitaxial oxide buffer layers can be yttrium oxide, cerium oxide, yttria-stabilized zirconia or others as well known to those skilled in the art.

The ultimate application can determine the selection of the material for the base substrate. For example, the selection of the base substrate on which a subsequent superconducting material (e.g., YBCO) is deposited can allow for the resultant article to be flexible whereby superconducting articles (e.g., coils, motors or magnets) can be shaped. Thus, for superconducting applications requiring flexible substrates, the base substrate is generally a polycrystalline metal as these materials are usually flexible, i.e., they can be shaped. For other applications, the base substrate on which other oriented materials are deposited may be polycrystalline ceramics, either flexible or non-flexible. For still other applications, the base substrate may be a single crystal substrate such as magnesium oxide, lanthanum aluminate, or aluminum oxide.

The present invention is more particularly described in the following examples that are intended as illustrative only, since numerous modifications and variations will be apparent to those skilled in the art.

Example 1

A coated conductor in accordance with the present invention was formed with the following structure: a Hastelloy base substrate/a layer of $Al_2O_3$/a layer of $Y_2O_3$/a layer of IBAD-MgO/a layer of $BaZrO_3$/a layer of $SrTiO_3$/a layer of YBCO. The layer of $BaZrO_3$ was deposited by pulsed laser deposition using a substrate temperature of 820° C., a background oxygen pressure of 0.3 Torr until a barium zirconate thickness of about 20 nanometers was formed. A layer of strontium titanate was formed upon the barium zirconate layer by PLD. A YBCO layer was deposited onto the strontium titanate layer and from this structure, the measured properties of the YBCO layer (1.3 μm in thickness) were: a superconducting transition temperature ($T_c$) of 88 K, an in-plane texture of 2.4° full width half maximum (FWHM), an out-of-plane texture of 1.2° FWHM and a critical current density ($J_c$) of 3.0 megamperes per square centimeter ($MA/cm^2$) at 75 K. The results for $J_c$ are as high as current state of the art measurements and demonstrate that the barium zirconate can provide comparable performance with the homoepitaxial MgO.

Example 2

A coated conductor in accordance with the present invention was formed with the following structure: a Hastelloy base substrate/a layer of $Al_2O_3$/a layer of $Y_2O_3$/a layer of IBAD-MgO/a layer of $BaZrO_3$/a layer of YBCO. The layer of $BaZrO_3$ was deposited by pulsed laser deposition using a substrate temperature of 820° C., a background oxygen pressure of 0.3 Torr until a barium zirconate thickness of from about 50 to about 80 nanometers was formed. The YBCO layer was deposited directly upon the barium zirconate layer and from this structure, the measured properties of the YBCO layer (1.2 μm in thickness) were: a $T_c$ of 87.7 K, an in-plane texture of 5° FWHM, an out-of-plane texture of 1.1° and a $J_c$ of 1.5 $MA/cm^2$. The results demonstrate that a barium zirconate layer can be used directly between the IBAD MgO layer and the YBCO and provide good barrier protection (in place of the homoepitaxial MgO and $SrTiO_3$ layers) and performance.

Example 3

A coated conductor in accordance with the present invention was formed with the following structure: a Hastelloy base substrate/a layer of $Al_2O_3$/a layer of $Y_2O_3$/a layer of IBAD-MgO/a layer of samarium zirconate ($Sm_{0.2}Zr_{0.8}O_{1.7}$)/a layer of YBCO. The layer of $Sm_{0.2}Zr_{0.8}O_{1.7}$ (about 30 nm in thickness) was deposited by reactive sputtering from metal targets of samarium and zirconium. The conditions used for the deposition included a substrate temperature of 750° C. and a background oxygen pressure of $1.0 \times 10^{-2}$ Torr. The texture for the samarium zirconate film was measured as about 5.9° FWHM for the in-plane texture and 2.8° FWHM for the out-of-plane texture. These texture values were very near those of the starting IBAD MgO template. After the deposition of the YBCO, the final YBCO in-plane texture value was 5° and 0.9° FWHM for the out-of-plane texture. The measured $T_c$ was 92.0 K and the $J_c$ was 0.9 MA/cm$^2$ for a 1.2 micrometer thick YBCO film. These results demonstrate that a samarium zirconate layer can be used directly between the IBAD MgO layer and the YBCO and provide good barrier protection (in place of the homoepitaxial MgO and SrTiO$_3$ layers) and performance.

Example 4

A coated conductor in accordance with the present invention was formed with the following structure: a Hastelloy base substrate/a layer of Al$_2$O$_3$/a layer of Y$_2$O$_3$/a layer of IBAD-MgO/a layer of samarium zirconate (Sm$_{0.3}$Zr$_{0.7}$O$_{1.5}$)/a layer of YBCO. The layer of Sm$_{0.3}$Zr$_{0.7}$O$_{1.5}$ (about 60 nm in thickness) was deposited by reactive sputtering from metal targets of samarium and zirconium. The conditions used for the deposition included a substrate temperature of 750° C. and a background oxygen pressure of $1.0 \times 10^{-2}$ Torr. The texture for the samarium zirconate film was measured as about 4.4° FWHM for the in-plane texture and 2.5° FWHM for the out-of-plane texture. Thus, it was found that increasing the samarium content in the samarium zirconate buffer layer improved its texture. After deposition of the YBCO, the final YBCO in-plane texture value was 2.7° FWHM for the in-plane texture and 1.1° FWHM for the out-of-plane texture. The measured $T_c$ was 89 K and the $J_c$ was 2.6 MA/cm$^2$ for a 1.5 micrometer thick YBCO film. These results demonstrate that a samarium zirconate layer can be used directly between the IBAD MgO layer and the YBCO and provide good barrier protection (in place of the homoepitaxial MgO and SrTiO$_3$ layers) and performance.

Example 5

Several coated conductors in accordance with the present invention were formed with the following structure: a Hastelloy base substrate/a layer of Al$_2$O$_3$/a layer of Y$_2$O$_3$/a layer of IBAD-MgO/a layer of samarium zirconate (Sm$_x$Zr$_{1-x}$O$_y$)/a layer of YBCO. The layer of Sm$_x$Zr$_{1-x}$O$_y$ (about 60 nm in thickness) was deposited by reactive sputtering from metal targets of samarium and zirconium. The atomic fraction (x) of the Sm in the samarium zirconate was varied (0.06<x<0.75) by changing the powers on the two RF sputter guns. The conditions used for the deposition included a substrate temperature of 750° C. and a background oxygen pressure of $1.0 \times 10^{-2}$ Torr. The in-plane texture for the samarium zirconate films was around 7° FWHM. After deposition of the YBCO, the final YBCO in-plane texture values were in the 5°-2.7° FWHM range. The measured $J_c$s were in the 2-3.6 MA/cm$^2$ range for about 1 micrometer thick YBCO films. The in-field performance of the coated conductors that use samarium ziconate as a buffer layer showed comparable performance to state of the art strontium titanate (STO) buffered coated conductors. These results demonstrate that a samarium zirconate layer can be used directly between the IBAD MgO layer and the YBCO and provide good barrier protection (in place of the homoepitaxial MgO and SrTiO$_3$ layers) and performance.

Although the present invention has been described with reference to specific details, it is not intended that such details should be regarded as limitations upon the scope of the invention, except as and to the extent that they are included in the accompanying claims.

What is claimed is:

1. A superconductive article comprising:
   a base substrate having a layer of an IBAD oriented material thereon;
   a layer of a barium-containing material selected from the group consisting of barium zirconate, barium hafnate, barium titanate, barium strontium titanate, barium dysprosium zirconate, barium neodymium zirconate and barium samarium zirconate, or a cubic metal oxide material selected from the group consisting of rare earth zirconates and rare earth hafnates upon the layer of IBAD oriented material; and,
   a layer of a high temperature superconductive oxide material upon the layer of barium-containing material selected from the group consisting of barium zirconate, barium hafnate, barium titanate, barium strontium titanate, barium dysprosium zirconate, barium neodymium zirconate and barium samarium zirconate, or a cubic metal oxide material selected from the group consisting of rare earth zirconates and rare earth hafnates.

2. The superconductive article of claim 1 wherein the high temperature superconductive oxide material is a yttrium barium copper oxide (YBCO).

3. An article comprising:
   a base substrate having a layer of an IBAD oriented material thereon; and,
   a layer of a barium-containing material selected from the group consisting of barium zirconate, barium hafnate, barium titanate, barium strontium titanate, barium dysprosium zirconate, barium neodymium zirconate and barium samarium zirconate, or a cubic metal oxide material selected from the group consisting of rare earth zirconates and rare earth hafnates upon the layer of IBAD oriented material.

4. The article of claim 3 wherein the layer of IBAD oriented material is selected from the group consisting of oriented oxide materials and oriented nitride material.

5. The article of claim 3 wherein the layer upon the IBAD oriented material is a barium-containing material selected from the group consisting of barium zirconate, barium hafnate, barium titanate, barium strontium titanate, barium dysprosium zirconate, barium neodymium zirconate and barium samarium zirconate.

6. The article of claim 3 wherein the layer upon the IBAD oriented material is a cubic metal oxide material selected from the group consisting of rare earth zirconates and rare earth hafnates.

7. The article of claim 6 wherein the layer of rare earth zirconates and rare earth hafnates have a composition of RE$_x$Zr$_{1-x}$O$_y$ or RE$_x$Hf$_{1-x}$O$_y$ where x is from about 0.06 to about 0.75.

8. The article of claim 3 wherein the layer of barium-containing material selected from the group consisting of barium zirconate, barium hafnate, barium titanate, barium strontium titanate, barium dysprosium zirconate, barium neodymium zirconate and barium samarium zirconate, or a cubic metal oxide material selected from the group consisting of rare earth zirconates and rare earth hafnates is from about 10 nm to about 100 nm in thickness.

9. The article of claim 3 wherein the layer of IBAD oriented material is magnesium oxide.

10. The article of claim 3 wherein said layer of a barium-containing material is barium zirconate.

11. The article of claim 3 wherein said layer of a rare earth-containing material is samarium zirconate.

12. The article of claim 3 wherein the base substrate is a flexible polycrystalline metal.

13. The article of claim 12 wherein the layer of a rare earth-containing material is samarium zirconate deposited by reactive sputtering.

14. The article of claim 3 wherein the base substrate further includes an inert oxide material layer between the base substrate and the layer of IBAD oriented material.

15. The article of claim 3 wherein the base substrate further includes an inert oxide material layer selected from the group consisting of aluminum oxide, erbium oxide, and yttrium oxide on the base substrate, and a layer of an oxide or oxynitride material upon the inert oxide material layer and the layer of IBAD oriented material is upon the layer of an oxide or oxynitride material.

16. The article of claim 15 wherein the inert oxide material layer is selected from the group consisting of aluminum oxide, erbium oxide, and yttrium oxide.

17. The article of claim 15 wherein the oxide or oxynitride material layer is selected from the group consisting of yttrium oxide, aluminum oxynitride, erbium oxide, yttria-stabilized zirconia, cerium oxide and europium oxide.

18. The article of claim 3 further including a layer of a high temperature superconductive oxide material upon the layer of barium-containing material selected from the group consisting of barium zirconate, barium hafnate, barium titanate, barium strontium titanate, barium dysprosium zirconate, barium neodymium zirconate and barium samarium zirconate, or a cubic metal oxide material selected from the group consisting of rare earth zirconates and rare earth hafnates.

19. The article of claim 18 wherein the high temperature superconductive oxide material is a yttrium barium copper oxide (YBCO).

20. The article of claim 19 wherein the layer of a yttrium barium copper oxide includes flux pinning particulates therein.

21. The article of claim 20 wherein the flux pinning particulates are of barium zirconate.

22. The article of claim 5 further including a layer of strontium titanate between the layer of barium-containing material selected from the group consisting of barium zirconate, barium hafnate, barium titanate, barium strontium titanate, barium dysprosium zirconate, barium neodymium zirconate and barium samarium zirconate and a YBCO layer.

* * * * *